United States Patent [19]
Elliott et al.

[11] Patent Number: 5,483,150
[45] Date of Patent: Jan. 9, 1996

[54] TRANSISTOR CURRENT SWITCH ARRAY FOR DIGITAL-TO-ANALOG CONVERTER (DAC) INCLUDING BIAS CURRENT COMPENSATION FOR INDIVIDUAL TRANSISTOR CURRENT GAIN AND THERMALLY INDUCED BASE-EMITTER VOLTAGE DROP VARIATION

[75] Inventors: Phillip L. Elliott, Fort Collins, Colo.; Dwight D. Birdsall, Norwalk, Calif.; Lloyd F. Linder, Agora Hills, Calif.; Kelvin T. Tran, Carson, Calif.

[73] Assignee: Hughes Aircraft Company, Los Angeles, Calif.

[21] Appl. No.: 17,200

[22] Filed: Feb. 5, 1993

[51] Int. Cl.⁶ ........................................... G05F 3/08
[52] U.S. Cl. ............................................ 323/312; 323/313
[58] Field of Search ............................. 341/144; 323/312, 323/313, 314, 316; 327/538, 362, 512, 583

[56] References Cited

U.S. PATENT DOCUMENTS

| | | | |
|---|---|---|---|
| 4,393,370 | 7/1983 | Hareyama | 340/347 DA |
| 4,771,227 | 9/1988 | Nelson | 323/315 |
| 4,952,867 | 8/1990 | Anderson et al. | 323/273 |
| 5,070,332 | 12/1991 | Kaller et al. | 341/156 |

OTHER PUBLICATIONS

"Bipolar and MOS Analog Integrated Circuit Design", by A. B. Grebene, J. Wiley & Sons, 1984, Chapter 14 entitled, "Data Conversion Circuits: Digital-to-Analog Conversion", pp. 753–824.

*Primary Examiner*—Peter S. Wong
*Assistant Examiner*—Adolf D. Berhane
*Attorney, Agent, or Firm*—Georgann S. Grunebach; Wanda K. Denson-Low

[57] ABSTRACT

A bias voltage source (20) produces a variable bias voltage (VBREF) which regulates the bias currents in an array (30) of transistor current switch cells (34,36) in an digital-to-analog converter (DAC). The bias voltage (VBREF) is applied to the bases of the regulating transistors (Q8') in the cells (34,36) to regulate the bias currents in their respective main transistors (Q6',Q7') to values proportional to the main bias current (IBIAS). Each main transistor (Q6,Q6',Q7,Q7') and regulating transistor (Q8,Q8') is provided with a compensating transistor (Q10,Q10')(Q11,–Q11') which sinks the emitter-base current thereof and cancels deviation of the actual current gain from the design current gain. Another compensating transistor (Q9,Q9') is connected to each regulating transistor (Q8,Q8') to cancel the effect of base-emitter voltage variation with temperature.

22 Claims, 3 Drawing Sheets

5,483,150

TRANSISTOR CURRENT SWITCH ARRAY FOR DIGITAL-TO-ANALOG CONVERTER (DAC) INCLUDING BIAS CURRENT COMPENSATION FOR INDIVIDUAL TRANSISTOR CURRENT GAIN AND THERMALLY INDUCED BASE-EMITTER VOLTAGE DROP VARIATION

This invention was made with Government support. The Government has certain rights in this invention.

BACKGROUND OF THE INVENTION

1. Field of the Invention

The present invention generally relates to the art of microelectronic precision current switch arrays for digital-to-analog converters (DAC) and other applications, and more specifically to a current switch array including bias current compensation for individual transistor current gain and thermally induced base-emitter voltage drop variation.

2. Description of the Related Art

A digital-to-analog converter (DAC) is used for converting a digital signal consisting of a number of digital binary bits into a continuously variable voltage or current. DACs per se are known in the art such as described in a textbook entitled "BIPOLAR AND MOS ANALOG INTEGRATED CIRCUIT DESIGN", by Alan B. Grebene, John Wiley & Sons, 1984, Chapter 14 entitled "DATA CONVERSION CIRCUITS: DIGITAL-TO-ANALOG CONVERSION", pp. 753–824.

DACs can use either voltage or current scaling. A typical DAC 10 which uses current scaling and produces a differential voltage output in response to a single-ended voltage input is illustrated in FIG. 1. The DAC 10 includes a plurality of transistor data current switches S1 to SN, where N is the number of bits of the digital binary word to be converted to analog form. The individual bits are input to the switches S1 to SN as digital bit inputs DATA1 to DATAN, which turn the switches S1 to SN on or off depending on the logical sense of the respective digital input.

The outputs of the switches S1 to SN are connected to a resistor scaling ladder network 12 including series resistors RS and parallel resistors RP in an arrangement which is symmetrical about ground to produce differential analog voltage outputs VOUT+ and VOUT−. The resistors RS and RP are designed to scale the outputs of the switches S1 to SN depending on the binary weights of the respective bits.

A reference voltage generator or source 14 generates a positive reference voltage VREF which is applied through a resistor R1 to a current source IS0 to cause a bias current IBIAS to flow through the source IS0. The source IS0 produces a variable bias voltage VBREF which is automatically adjusted by the source IS0 to maintain the bias current IBIAS equal to a predetermined value.

The bias voltage VBREF is applied to current sources IS1 to ISN which cause bias currents which are equal or proportional to the bias current IBIAS to flow through the switches S1 to SN respectively. When one or more of the switches S1 to SN are closed in accordance with the value of the digital input, current flows from ground through the associated resistors in the network 12, the closed switches S1 to SN and the current sources IS1 to ISN respectively to a negative D.C. voltage source VEE.

The currents through the switches S1 to SN are scaled and summed by the network 12 to produce the differential analog output voltages VOUT+ and VOUT−. An operational or other differential amplifier 16 may be provided to produce a single-ended analog output voltage VOUT which is proportional to the difference between the differential output voltages VOUT+ and VOUT− and thereby to the value of the digital input signal represented by the bit inputs DATA1 to DATAN.

An example of the current sources IS0 and IS1 and the switch S1 as illustrated on page 793 of the above referenced textbook to Grebene is illustrated in FIG. 2. The reference voltage VREF from the source 14 is applied through the resistor R1 to the non-inverting input of an operational amplifier 18 which is connected in a negative feedback configuration. The inverting input of the amplifier 18 is connected to ground.

The output of the amplifier 18 is connected to the base of an NPN bipolar transistor Q1, the emitter of which is connected through a resistor R2 to the source VEE. The collector of the transistor Q1 is connected to the non-inverting input of the amplifier 18.

The amplifier 18 produces the bias voltage VBREF at its output, and adjusts the value of VBREF and thereby the base voltage and current flow through the transistor Q1 until the voltage at the non-inverting input of the amplifier 18 is equal to the voltage at the inverting input thereof. Since the inverting input of the amplifier 18 is grounded, the voltage VBREF will be adjusted to maintain the voltage at the non-inverting input of the amplifier 18 at zero volts.

This causes the voltage VREF to be dropped across the resistor R1 such that the current IBIAS through the resistor R1 is equal to VREF divided by the resistance value of the resistor R1. Since substantially no current can flow through the non-inverting input of the amplifier 18, the current IBIAS is forced to flow into the collector of the transistor Q1.

The switch S1 includes NPN transistors Q2 and Q3 which are connected in a differential configuration with their emitters connected together. The collectors of the transistors Q2 and Q3 produce differential current outputs IOUT+ and IOUT− which are applied to the scaling network 12. The digital input DATA1 is applied to the base of the transistor Q2, whereas a bias voltage VBIAS is applied to the base of the transistor Q3.

The emitters of the transistors Q2 and Q3 are connected through a regulating transistor Q4 of the source IS1. The emitter of the transistor Q4 is connected through a resistor R3 to the source VEE, whereas the bias voltage VBREF is applied to the base of the transistor Q4.

The transistor Q3 provides a switching threshold at the voltage VBIAS which is preferably equal to one-half the maximum value of the input DATA1. When the input DATA1 is high, the transistor Q2 is turned on and the transistor Q3 is turned off, and vice-versa. The transistor Q4 is biased by the voltage VBREF to cause a constant bias current which is proportional to the current IBIAS to flow through the emitter of whichever of the transistors Q2 and Q3 is turned on.

Assuming that the transistors Q1 and Q4 and the resistors R2 and R3 are identical, the collector current of the transistor Q4 which constitutes the bias current for the transistors Q2 and Q3 will be equal to IBIAS.

However, since the transistors Q2 and Q3 have finite base current, the output current IOUT+ or IOUT− will be smaller than IBIAS by the base current of the transistor Q2 or Q3 respectively. In addition, the base currents of the transistors Q2 and Q3 will vary depending on the deviation in the actual current gain $\beta$ of the transistors Q2 and Q3 from their predetermined design current gain, and temperature induced variations in emitter-base voltage and base current.

To cancel these variations, the direct connection between the collector of the transistor Q1 and the non-inverting input of the amplifier 18 is replaced by an NPN transistor Q5 as illustrated in broken line. The collector of the transistor Q5 is connected to the non-inverting input of the amplifier 18, whereas the emitter of the transistor Q5 is connected to the collector of the transistor Q1. The voltage VBIAS is applied to the base of the transistor Q5.

The transistor Q5 is designed to be identical to the transistors Q2 and Q3, such that the base currents of the transistors Q2 and Q3 will be the same as the base current I5 of the transistor Q5 at a particular value of bias voltage VBIAS. Thus, a base current I5 of the transistor Q5 is added to IBIAS in the feedback loop around the amplifier 18, and the bias voltage VBREF is adjusted to regulate the collector current of the transistor Q1 and thereby Q4 to IBIAS+I5.

The collector current of whichever transistor Q2 or Q3 is turned on is equal to the emitter current minus the base current thereof, with the base current being equal to I5. The collector current of the transistor Q2 or Q3 is therefore equal to IBIAS.

The switches S2 to SN and the current sources IS2 to ISN are identical to the switch S1 and current source IS1. The addition of the transistor Q5 provides global compensation for base current variations of the transistors in the switches S1 to SN in that the bias voltage VBREF is compensated by the transistor Q5 to be proportional to absolute temperature (PTAT), and is fanned out to all of the current sources IS1 to ISN respectively.

However, a practical DAC includes a large number, for example 64, current switches fabricated as a monolithic integrated circuit on a single chip. Due to the limitations of practical microcircuit fabrication technology, the current gain β of the transistors will not be identical as desired. The tolerance between adjacent transistors is typically several percent, and this tolerance spread out as a gradient across a chip such that the β of transistors at opposite ends of a chip can differ by over ten percent.

This causes the currents representing the individual bits of the digital input to vary from their design values, and cause distortion which limits the linearity and accuracy of the analog output signal.

In addition, the base-emitter voltage drops Vbe of the current source transistors vary as a function of temperature. More specifically, Vbe decreases as temperature increases. This causes an increase in emitter current for a given value of base voltage. There can be a substantial temperature gradient across a large integrated circuit chip, which will cause the Vbe of the individual transistors to vary from each other and cause distortion and non-linearity.

The transistor Q5 in the prior art arrangement of FIG. 2 is therefore able to provide only global or first order compensation for variations in bias current, and is incapable of compensating for differences between individual transistors and temperature variations across a large chip.

SUMMARY OF THE INVENTION

In accordance with the present invention, a bias voltage source produces a variable bias voltage which regulates the bias currents in an array of transistor current switch cells in an digital-to-analog converter (DAC).

The bias voltage source includes a reference voltage generator which causes a main bias current to flow through a main transistor. A current regulating transistor is connected in series with the main transistor and has a base connected to receive the bias voltage. A feedback amplifier senses the main bias current and adjusts the bias voltage such that the regulating transistor regulates the main bias current to a predetermined value.

Each current switch cell includes a main transistor and a regulating transistor which are identical to their counterparts in the bias voltage source. The bias voltage is applied to the bases of the regulating transistors in the cells to regulate the bias currents in their respective main transistors to values proportional to the main bias current.

Each main transistor and regulating transistor is provided with a compensating transistor which sinks the emitter-base current thereof and cancels deviation of the actual current gain from the design current gain. Another compensating transistor is connected to each regulating transistor to cancel the effect of base-emitter voltage variation with temperature.

In this manner, the transistors in the bias voltage source and the current switch cells are individually compensated for β and Vbe variations. Since the compensating transistors are located closely adjacent to the main and regulating transistors, the problem of matching a large number of transistors across an array as in the prior art is reduced to matching two transistors which are closely adjacent to each other.

The compensation provided by the present invention is local and individual, as opposed to the global compensation of the prior art. This enables a DAC or other apparatus in which the present bias voltage source and transistor cell array are incorporated to have substantially increased linearity which has not been previously attainable.

Although the present invention is especially suitable for embodiment as a current switch cell array for a DAC, it can alternatively be embodied as a transistor cell array including switching, amplifying or buffering transistors for any other desired application.

These and other features and advantages of the present invention will be apparent to those skilled in the art from the following detailed description, taken together with the accompanying drawings, in which like reference numerals refer to like parts.

DETAILED DESCRIPTION OF THE INVENTION

Figure 3:
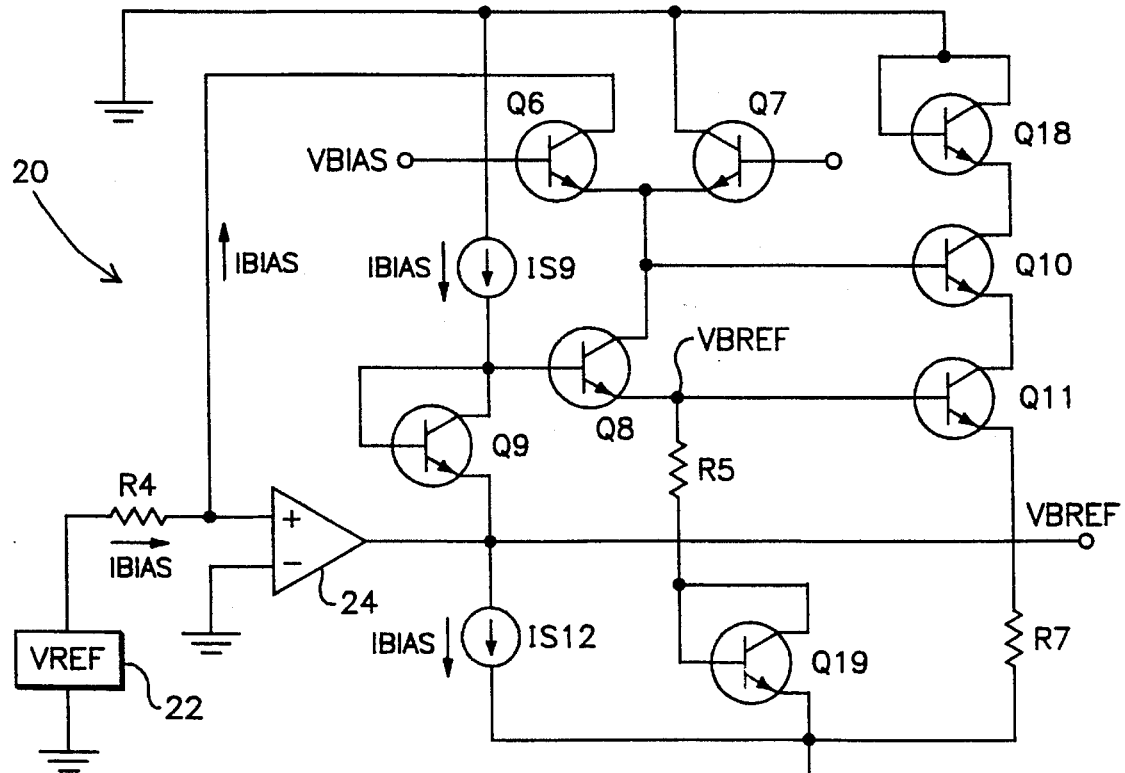
FIG. 3 is a simplified electrical schematic diagram illustrating a bias voltage source embodying the present invention.

As illustrated in FIG. 3, a bias voltage source 20 for a current switch cell array of a digital-to-analog converter (DAC) or other apparatus includes a reference voltage generator or source 22 which generates a positive D.C. reference voltage VREF. The source 22 is connected through a resistor R4 to the non-inverting input of an operational amplifier 24, the inverting input of which is grounded. The non-inverting input of the amplifier 24 is also connected to the collector of an NPN bipolar main transistor Q6, the base of which is connected to receive a bias voltage VBIAS.

The emitter of the transistor Q6 is connected to the emitter of an identical main transistor Q7, the collector of which is grounded and the base of which is allowed to float. The emitters of the transistors Q6 and Q7 are connected to the collector of an NPN regulating transistor Q8, the emitter of which is connected through a resistor R5 and a transistor Q19 to a negative D.C. power source VEE. The transistor Q19 is connected to function as a diode, with its base connected to its collector.

In accordance with the invention, the output of the amplifier 24 is connected to the emitter of a diode-connected NPN compensating transistor Q9, the collector of which is connected to the base of the transistor Q8. A current source IS9 causes a bias current to flow through the transistor Q9 and a current sink IS12 to the source VEE.

The emitters of the transistors Q6 and Q7 are connected to the base of a compensating transistor Q10, the emitter of which is connected to the collector of a compensating transistor Q11. The collector of the transistor Q10 is connected to ground through a diode-connected transistor Q18. The base of the transistor Q11 is connected to the emitter of the transistor Q8. The emitter of the transistor Q11 is connected through a resistor R7 to the source VEE.

The amplifier 24 produces a variable bias voltage VBREF, which is applied through the transistor Q9 to the base of the regulating transistor Q8. The transistor Q6 is constantly turned on, whereas the transistor Q7 is constantly turned off. The transistor Q8 functions as a series current regulator for the transistor Q6 and regulates the bias current flowing therethrough.

More specifically, the bias current flowing through the transistor Q6 is regulated by the bias voltage VBREF. An increase in VBREF causes an increase in bias current, and vice-versa. The voltage VREF generated by the source 22 causes a current to flow through the resistor R4, transistors Q6 and Q8 and resistor R5 to the source VEE.

The amplifier 24 operates in a feedback configuration to regulate the bias current to a value at which the voltage at the non-inverting input of the amplifier 24 becomes equal to the voltage at the inverting input thereof. Since the inverting input of the amplifier 24 is grounded, the amplifier 24 varies the bias voltage VBREF and thereby the bias current such that the voltage at the non-inverting input of the amplifier 24 is maintained at ground potential (zero volts).

The voltage VREF is therefore dropped across the resistor R4, and causes a predetermined main bias current IBIAS to flow through R4 which is equal to VREF divided by the resistance value of the resistor R4. Since current cannot flow through the non-inverting input of the amplifier 24, the current IBIAS is forced to flow through the transistors Q6 and Q8 and resistor R5 to the source VEE.

Figure 2:
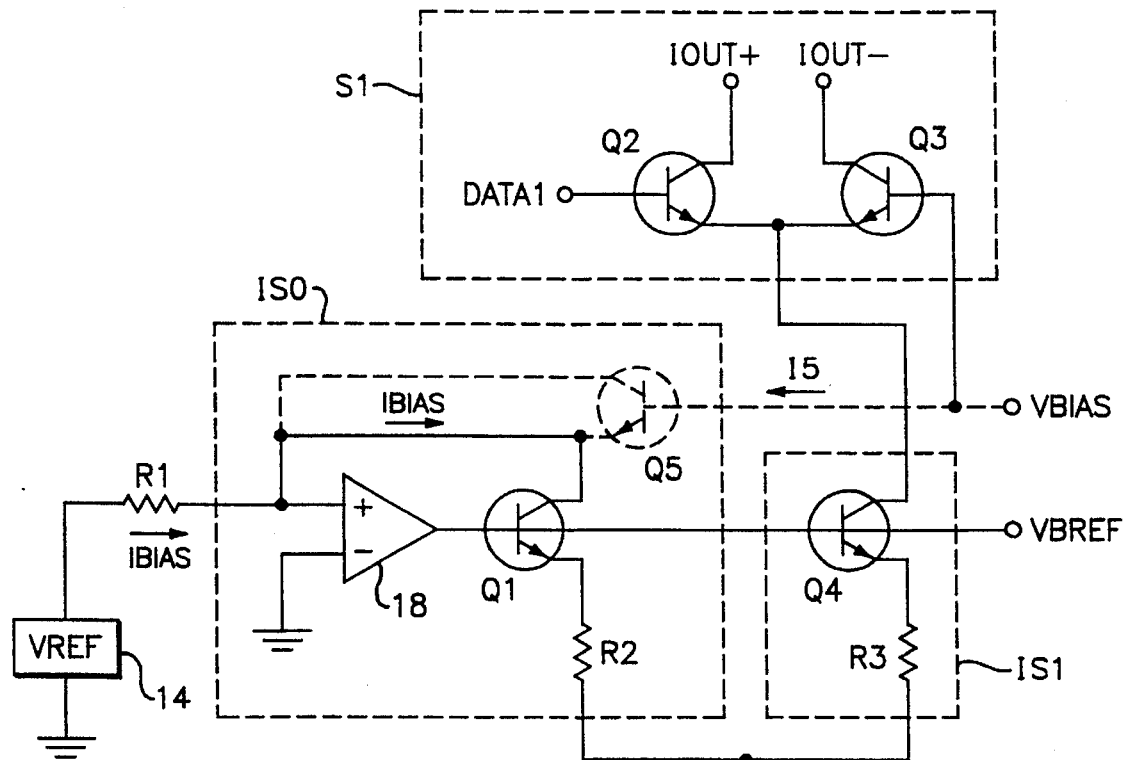
FIG. 2 illustrates the bias voltage source, and a current switch and associated current source of the DAC of FIG. 1.

If the transistor Q9 was omitted and the output of the amplifier 24 was connected directly to the base of the transistor Q8 as in the prior art arrangement illustrated in FIG. 2, the voltage at the emitter of the transistor Q8 would be lower than the bias voltage VBREF by the voltage drop Vbe across the base-emitter junction of the transistor Q8. The voltage drop Vbe is not fixed, but varies as a function of ambient temperature. More specifically, Vbe decreases as the temperature increases by approximately 1.5–2.0 millivolts per degree Centigrade. A decrease in Vbe causes an increase in emitter current flow for a given value of base voltage.

As a result, a variation in the Vbe of the transistor Q8 would cause the bias voltage VBREF to adjust to a different value to maintain the non-inverting input of the amplifier 24 at zero volts and thereby the bias current through the transistors Q6 and Q8 at IBIAS.

The bias voltage VBREF is fanned out to the current regulating transistors in all of the individual current switch cells in a DAC. If the entire integrated circuit chip were maintained at the same temperature and all of the current regulating transistors had the same characteristics, the Vbe of all of the regulating transistors would vary together and there would be no variation in current between the cells and no distortion or non-linearity.

However, in a practical DAC, there can be a substantial temperature gradient across the switch cell array, and the Vbe of the individual regulating transistors will vary in accordance with the local temperature. Each regulating transistor will cause a bias current to flow therethrough in response to the bias voltage VBREF which varies in accordance with the temperature and the Vbe of the individual regulating transistor. This will cause current outputs of the switch cells to vary, and introduce distortion and non-linearity into the DAC.

This problem is overcome in accordance with the present invention by the transistor Q9. The transistors Q8 and Q9 are designed to be identical, or at least to have the same variation in Vbe as a function of temperature. The current source IS9 and current sink IS12 cause the bias current IBIAS to flow through the transistor Q9. Thus, although the Vbe of the transistors Q8 and Q9 will vary with temperature, they will be the same.

The voltage at the collector of the transistor Q9 is equal to VBREF+Vbe(Q9). The voltage at the emitter of the transistor Q8 is equal to [VBREF+Vbe(Q9)]−Vbe(Q8). Since Vbe(Q8)=Vbe(Q9), the voltage at the emitter of the transistor Q8 is equal to VBREF. In this manner, the transistor Q9 cancels the Vbe of the transistor Q8, the bias voltage VBREF does not vary with temperature, and the bias current of the transistors Q6 and Q8 is independent of the Vbe of the transistor Q8 and thereby any thermally induced variation thereof.

The collector current of the transistor Q6 (which corresponds to the output currents in the switch cells of the DAC) is a function of the current gain $\beta$ of the transistors Q6 and Q8. More specifically, the collector current $Iout=[\beta/(\beta+1)]^3$. Although the $\beta$ of closely adjacent transistors can be matched using conventional processing technology to within several percent, the $\beta$ of transistors which are spaced from each other across a large integrated circuit chip can vary from each other by more than ten percent. This will cause the output currents of the individual bit switches to vary and constitute another source of distortion and non-linearity in a DAC.

This problem is overcome in accordance with the present invention by the transistors Q10 and Q11. The transistor Q10 is designed to be identical to, or at least have the same $\beta$ as the transistors Q6 and Q7. The transistor Q11 is similarly matched to the transistor Q8.

The emitter current Ie of the transistor Q6 is equal to Ie=Ic+Ib, where Ic is the collector current and Ib is the base current. The base current Ib=Ic/$\beta$, and the emitter current can thereby be rewritten as Ie=Ic+Ic/$\beta$.

The collector current Ic of the transistor Q6 is IBIAS due to the action of the feedback loop of the amplifier 24. If the transistor Q10 were not present, the emitter current Ie of the transistor Q6 would be IBIAS+Ic/$\beta$. The amplifier 24 would regulate the bias voltage VBREF to a value which is dependent on the $\beta$ of the transistor Q6. The bias voltage VBREF would be similarly influenced by the $\beta$ of the transistor Q8.

The resistance values of the resistors R5 and R7 are designed to be the same. The bias voltage VBREF appears across the series circuit leg including the resistor R5 and diode-connected transistor Q19, and also across the series circuit leg including the base-emitter junction of the transistor Q11 and the resistor R7. Since the resistance and Vbe drop in these two circuit legs are the same, the current through them is also the same and is equal to IBIAS.

Since the same collector current IBIAS flows through the transistors Q6 and Q10, the base currents Ib will also be the same. The base current of the transistor Q6 flows out of the emitter thereof, whereas the base current of the transistor Q10 flows into the base thereof. Since the base of the transistor Q10 is connected to the emitter of the transistor Q6, the net base current flow from the junction thereof into the collector of the transistor Q8 is zero.

In this manner, the base current of the transistor Q6 is removed or sunk by the transistor Q10, and the current flowing from the emitter of the transistor Q6 into the collector of the transistor Q8 is IBIAS. The effect of the $\beta$ of the transistor Q6 which causes a variation in base current and thereby emitter current is eliminated by removing the base current from the emitter of the transistor Q6. The transistor Q11 sinks the base current from the emitter of the transistor Q8 in an essentially similar manner. Thus, the bias voltage VBREF is independent of the $\beta$ of the transistors Q6 and Q8.

Since the transistors Q6 and Q10 and the transistors Q8 and Q11 are spaced closely adjacent to each other, the problem of matching a large number of transistors over a large integrated circuit chip is reduced to the problem of matching two adjacent transistors Q6,Q10 and Q8,Q11. This can be done relatively easily and accurately.

Figure 1:
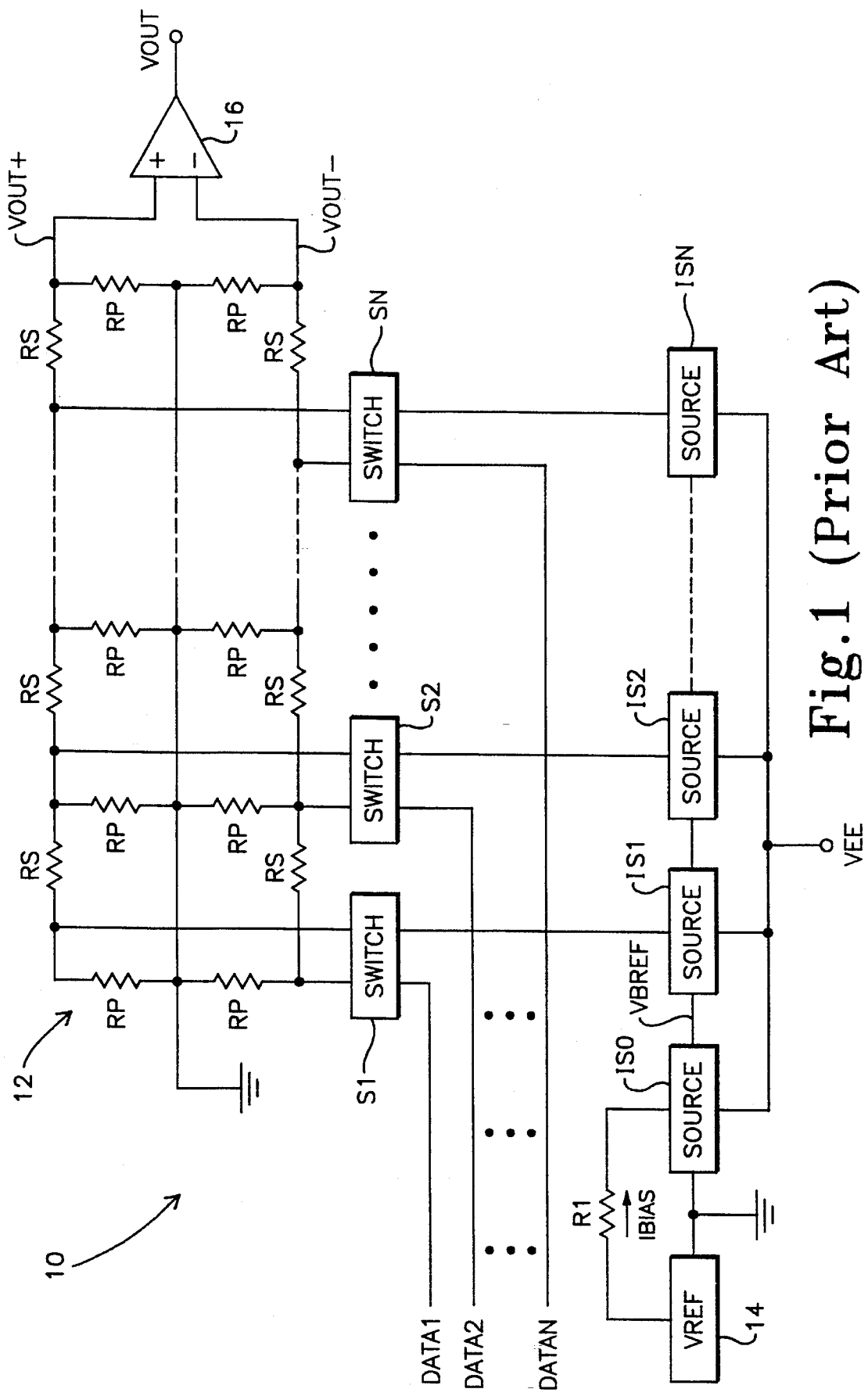
FIG. 1 is a simplified electrical schematic diagram illustrating a typical analog-to-digital converter (DAC) including a bias voltage source and current switch array.
Figure 4:
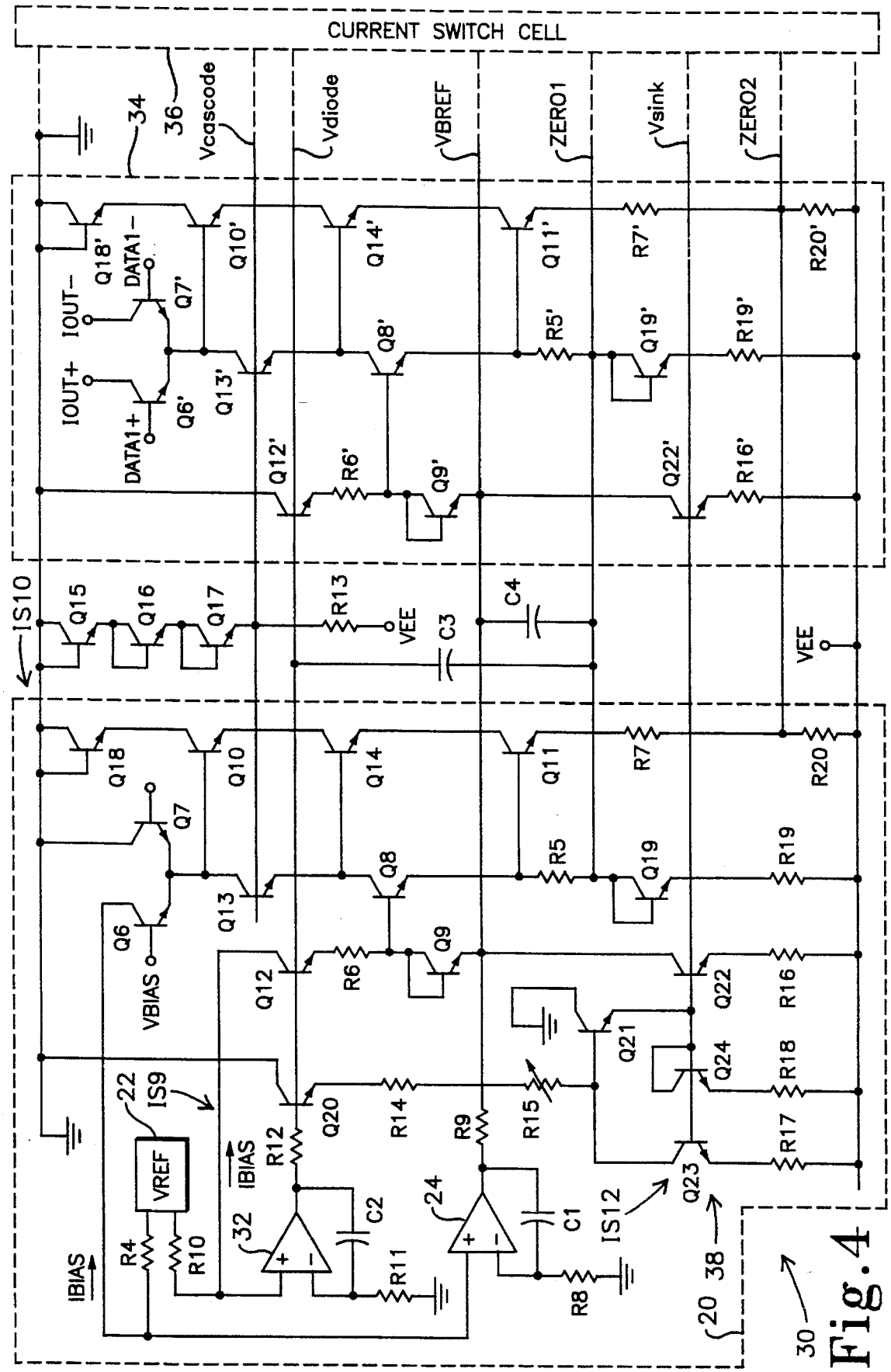
FIG. 4 is detailed electrical schematic diagram illustrating the bias voltage source and a transistor current switch cell array embodying the present invention.

FIG. 4 illustrates the bias voltage source 20 in more detail as incorporated into a transistor current switch cell array 30 of a DAC. Although not specifically illustrated in FIG. 4, a DAC which incorporates the array 30 can further be provided with a current scaling resistor ladder such as illustrated at 12 in FIG. 1, and associated components.

It will be understood, however, that the present transistor cell array 30 is not limited to a DAC which utilizes a current scaling resistor ladder, but can be incorporated into a DAC or other apparatus which utilizes voltage scaling, or non-scaled switch or amplifier cells.

The direct connection of the output and inverting input of the amplifier 24 is replaced by a capacitor C1, and a resistor R8 is connected between the inverting input of the amplifier 24 and ground as illustrated to improve the stability of the amplifier 24. A resistor R9 is connected between the output of the amplifier 24 and the emitter of the transistor Q9. A resistor R6 is connected between the collector of the transistor Q9 and the current source IS9.

The current source IS9 includes an operational amplifier 32 having a non-inverting input connected through a resistor R10 to the source 22. The value of the resistor R10 is selected to be the same as the resistor R4 such that the bias current IBIAS is caused to flow through the resistor R10. A capacitor C2 and resistor R11 are connected to the amplifier 32 to improve the stability thereof in a manner which is essentially similar to the amplifier 24.

The current source IS9 further includes a regulating transistor Q12 into the collector of which the current IBIAS flows from the resistor R10. The emitter of the transistor Q12 is connected through the resistor R6 to the collector of the transistor Q9. The output of the amplifier 32 is connected through a resistor R12 to the base of the transistor Q12 such that the amplifier 32 produces a bias voltage Vdiode which causes the transistor Q12 to regulate the bias current through the diode-connected transistor Q9 to IBIAS.

A cascode connected transistor Q13 is connected between the transistors Q6 and Q8 to provide increased impedance and isolate the transistor Q6 from the transistor Q8. A series string of diode-connected transistors Q15, Q16 and Q17 and a resistor R13 constitute a voltage divider which provides a bias voltage Vcascode for the transistor Q13.

A compensating transistor Q14 has a collector connected to the emitter of the transistor Q10, an emitter connected to the base of the transistor Q11 and a base connected to the emitter of the transistor Q13. The transistor Q14 sinks the base current of the transistor Q13 in the manner described above to eliminate the effect of the $\beta$ of the transistor Q13 from the collector current of the transistor Q6. The diode-connected transistor Q18 matches the collector-emitter voltage Vce of the transistor Q10 to that of the transistor Q6.

The array 30 further includes a plurality, for example 64, transistor current switch cells. One cell 34 is illustrated in detail, whereas additional cells are symbolically designated by a collective block 36. The cells 34 and 36 include components which are identical to corresponding components in the bias voltage source 20, and are designated by the same reference numerals primed.

The main difference between the source 20 and cells 34 and 36 is that the transistor Q6' is not connected to the non-inverting input of the amplifier 24. Instead, the collector of the transistor Q6' produces a differential current output IOUT+. The collector of the transistor Q7' produces a differential output current IOUT−. Differential inputs DATA1+ and DATA1− are applied to the bases of the transistors Q6' and Q7' respectively.

The cell 34 is outside the feedback loops of the amplifiers 24 and 32. Thus, the regulating transistors Q8' and Q12' will cause bias currents to flow through the transistor Q6' or Q7' (one will be turned on and the other turned off in accordance with the logical sense of the inputs DATA1+ and DATA1−) and the transistor Q9' in an open loop manner in accordance with the bias voltages VBREF and Vdiode respectively.

However, due to the effect of the compensating transistors Q9', Q10', Q11' and Q14', the bias currents of the transistors Q6' and Q7' and thereby the output currents IOUT+ and IOUT− of the cell 34 as well as the cells 36 will be equal and independent of $\beta$ and Vbe variations of the individual transistors across the array 30. Thus, the array 30 is highly linear and free from distortion as compared to the prior art.

In a large integrated circuit configuration, the emitters of the transistors Q9 and Q9' are interconnected by a bus line which carries the bias voltage VBREF. The bus line will have a small but finite resistance which will develop voltage drops if the currents IBIAS are injected into the bus line from the emitters of the transistors Q9 and Q9'. This will cause a variation in the value of VBREF along the bus line, a corresponding output current variation in the cells 34 and 36, and also require the amplifier 24 to sink all of this current.

For this reason, a current sink IS12 is provided to sink the currents IBIAS from the transistors Q9 and Q9' and substantially eliminate any voltage drop along the VBREF bus. The sink IS12 includes a transistor Q20 having a base connected to the base of the transistor Q12 to receive the bias voltage Vdiode, a collector connected to ground and an emitter connected through a fixed resistor R14 and a variable resistor R15 to the base of a transistor Q21.

The collector of the transistor Q21 is connected to ground, whereas the emitter thereof is connected to the base of a transistor Q22. The collector of the transistor Q22 is connected to the emitter of the transistor Q9, whereas the emitter of the transistor Q22 is connected through a resistor R16 to the source VEE.

The base of the transistor Q21 is also connected to the collector of a transistor Q23, the base of which is connected to the base of the transistor Q22 and the emitter of which is connected through a resistor R17 to the source VEE. The base of the transistor Q23 is also connected to the base of a diode-connected transistor Q24, the emitter of which is connected through a resistor R18 to the source VEE.

The transistor Q20 causes a bias current to flow therethrough which is proportional to IBIAS and corresponds to the bias voltage Vdiode. The transistors Q21, Q23 and Q24 and resistors R17 and R18 constitute an input of a current mirror 38, whereas the transistor Q22 and resistor R16 constitute the output thereof. The bias current through the transistor Q20 is scaled up sufficiently such that the currents IBIAS flowing out of the transistors Q9 and Q9' can be sunk by the transistors Q22 and Q22'.

The resistor R15 constitutes an adjustment enabling the transistor Q22 to sink all of the current flowing into the VBREF bus, and thereby substantially eliminate current flow therethrough and the accompanying voltage drops. The resistor R15 is adjusted to vary the input current of the current mirror 38, and the voltage across the resistor R9 is monitored until it is becomes zero.

When the voltage across the resistor R9 is zero, it indicates that the amplifier 24 is not sourcing or sinking current through the resistor R9, and the output current of the current mirror 38 is equal to the sum of the currents IBIAS injected into the VBREF bus from the transistors Q9 and Q9'. Thus, the current flow through the VBREF bus is substantially eliminated.

The resistors R5 and R5' are also interconnected by a bus in a large integrated circuit configuration. Due to the design of the circuit, there will also be an accumulation and corresponding voltage drop along this bus. For this reason, the bus which interconnects the resistors R5 and R5' is designated as ZERO1, indicating that there will ideally be zero current in the bus ZERO1.

This is accomplished by connecting small value resistors R19 and R19' between the resistors R5 and R5' and the source VEE to locally bleed off any accumulated current on the bus ZERO1. Thus, the bus ZERO1 is maintained at substantially VEE with no current flowing therethrough.

In a similar manner, the resistors R7 and R7' are connected to a zero current bus ZERO2, and also to small value resistors R20 and R20' which locally bleed off any accumulated current to the source VEE. Further illustrated are a capacitor C3 connected between the Vdiode bus and the ZERO1 bus, and a capacitor C4 connected between the VBREF bus and the ZERO1 bus to enhance decoupling and power supply rejection of the source VEE.

While an illustrative embodiment of the invention has been shown and described, numerous variations and alternate embodiments will occur to those skilled in the art, without departing from the spirit and scope of the invention.

For example, although the bias voltage source and transistor cell array of the present invention have been described and illustrated as being embodied using bipolar transistors, they may alternatively be embodied by field-effect or other types of transistors which provide the required functions.

Accordingly, it is intended that the present invention not be limited solely to the specifically described illustrative embodiment. Various modifications are contemplated and can be made without departing from the spirit and scope of they invention as defined by the appended claims.

We claim:

1. A transistor bias voltage source, comprising:

a main transistor having a predetermined design current gain;

reference voltage means for producing a predetermined reference voltage which causes a main bias current to flow through the main transistor;

a regulating transistor for regulating said main bias current;

feedback amplifier means for sensing said main bias current and generating a variable bias voltage which causes the regulating transistor to regulate said main bias current to a predetermined value; and compensation means for substantially canceling at least one of a deviation of the actual current gain of the main transistor from said design current gain and a thermally variable voltage drop in the regulating transistor.

2. A bias voltage source as in claim 1, in which:

the main transistor is a bipolar transistor including an emitter, a base and a collector; and the compensation means comprises a compensating element connected to the emitter of the main transistor for causing the base-emitter current of the main transistor to flow therethrough.

3. A bias voltage source as in claim 2, in which:

the compensating element comprises a bipolar transistor which includes an emitter, a base and a collector and has the same predetermined design current gain as the main transistor;

the base of the compensating transistor is connected to the emitter of the main transistor; and the compensation means further comprises current source means for causing a compensation bias current which is substantially equal to said predetermined value of main bias current to flow through the compensating transistor.

4. A bias voltage source as in claim 1, in which:

the regulating transistor has a predetermined design current gain; and the compensation means further comprises means for substantially canceling a deviation of the actual current gain of the regulating transistor from said design current gain thereof.

5. A bias voltage source as in claim 4, in which:

the regulating transistor is a bipolar transistor including an emitter, a base and a collector; and the compensation means comprises a compensating element connected to the emitter of the regulating transistor for causing the emitter-base current of the regulating transistor to flow therethrough.

6. A bias voltage source as in claim 5, in which:

the compensating element comprises a compensating transistor which includes an emitter, a base and a collector and has the same predetermined design current gain as the regulating transistor;

the base of the compensating transistor is connected to the emitter of the regulating transistor; and the compensation means further comprises current source means for causing a compensation bias current which is substantially equal to said predetermined value of main bias current to flow through the compensating transistor.

7. A bias voltage source as in claim 1, in which:

the regulating transistor is a bipolar transistor including an emitter, a base and a collector;

said thermally variable voltage drop is a base-emitter voltage drop of the regulating transistor;

the amplifier means comprises an output for producing said bias voltage; and the compensation means comprises a compensating element which is connected between the output of the amplifier means and the base of the regulating transistor and has a thermally variable compensating voltage drop which is substantially equal to said base-emitter voltage drop of the regulating transistor.

8. A bias voltage source as in claim 7, further comprising:

current source means for causing a compensation bias current which is substantially equal to said predetermined value of main bias current to flow through the compensating element; and current sink means for sinking said compensation bias current from the output of the amplifier means such that substantially no current flows through the output of the amplifier means.

9. A bias voltage source as in claim 7, in which:

the compensating element comprises a diode-connected compensating transistor; and said thermally variable compensating voltage drop is a base-emitter voltage drop of the compensating transistor.

10. A bias voltage source as in claim 9, in which:

the compensation means further comprises current source means for causing a compensation bias current which is substantially equal to said predetermined value of main bias current to flow through the compensating transistor.

11. A bias voltage source as in claim 10, further comprising current sink means for sinking said compensation bias current from the output of the amplifier means such that substantially no current flows through the output of the amplifier means.

12. A transistor cell array, comprising:

a bias voltage source, including:

a source main transistor having a predetermined design current gain;

reference voltage means for producing a predetermined reference voltage which causes a main bias current to flow through the source main transistor;

a source regulating transistor for regulating said main bias current;

feedback amplifier means for sensing said main bias current and generating a variable bias voltage which causes the source regulating transistor to regulate said main bias current to a predetermined value; and source compensation means for substantially canceling at least one of a deviation of the actual current gain of the source main transistor from said design current gain and a thermally variable voltage drop in the source regulating transistor; and a plurality of transistor cells, each including:

a cell main transistor which is substantially identical to the source main transistor;

a cell regulating transistor which is substantially identical to the source regulating transistor for regulating bias current flow through the cell main transistor to a value corresponding said bias voltage; and cell compensation means for substantially canceling at least one of a deviation of the actual current gain of the cell main transistor from said design current gain and a thermally variable voltage drop in the cell regulating transistor.

13. An array as in claim 12, in which:

the source main transistor is a bipolar transistor including an emitter, a base and a collector; and the source compensation means comprises a source compensating element connected to the emitter of the source main transistor for causing the emitter-base current of the source main transistor to flow therethrough;

each cell main transistor is a bipolar transistor including an emitter, a base and a collector; and each cell compensation means comprises a cell compensating element connected to the emitter of the cell main transistor for causing the emitter-base current of the cell main transistor to flow therethrough.

14. An array as in claim 13, in which:

the source compensating element comprises a bipolar transistor which includes an emitter, a base and a collector and has the same predetermined design current gain as the source main transistor;

the base of the source compensating transistor is connected to the emitter of the source main transistor;

the compensation means further comprises current source means for causing a compensation bias current which is substantially equal to said predetermined value of main bias current to flow through the source compensating transistor;

each cell compensating element comprises a bipolar transistor which includes an emitter, a base and a collector and has the same predetermined design current gain as the cell main transistor;

the base of the cell compensating transistor is connected to the emitter of the cell main transistor; and the cell compensation means further comprises current source means for causing a compensation bias current which is substantially equal to said predetermined value of main bias current to flow through the cell compensating transistor.

15. An array as in claim 12, in which:

the source regulating transistor has a predetermined design current gain;

the source compensation means further comprises means for substantially canceling a deviation of the actual current gain of the source regulating transistor from said design current gain thereof;

each cell regulating transistor has a predetermined design current gain; and each cell compensation means further comprises means for substantially canceling a deviation of the actual current gain of the cell regulating transistor from said design current gain thereof.

16. An array as in claim 15, in which:

the source regulating transistor is a bipolar transistor including an emitter, a base and a collector;

the source compensation means comprises a compensating element connected to the emitter of the source regulating transistor for causing the emitter-base current of the source regulating transistor to flow therethrough;

each cell regulating transistor is a bipolar transistor including an emitter, a base and a collector; and each cell compensation means comprises a compensating element connected to the emitter of the cell regulating transistor for causing the emitter-base current of the cell regulating transistor to flow therethrough.

17. An array as in claim 16, in which:

the source compensating element comprises a source compensating transistor which includes an emitter, a base and a collector and has the same design current gain as the source regulating transistor;

the base of the source compensating transistor is connected to the emitter of the source regulating transistor; and the source compensation means further comprises current source means for causing a compensation bias current which is substantially equal to said predetermined value of main bias current to flow through the source compensating transistor;

each cell compensating element comprises a cell compensating transistor which includes an emitter, a base and a collector and has the same design current gain as the cell regulating transistor;

the base of the cell compensating transistor is connected to the emitter of the cell regulating transistor; and the cell compensation means further comprises current source means for causing a compensation bias current which is substantially equal to said predetermined value of main bias current to flow through the cell compensating transistor.

18. An array as in claim 12, in which:

the source regulating transistor is a bipolar transistor including an emitter, a base and a collector;

said thermally variable voltage drop of the source regulating transistor is a base-emitter voltage drop thereof;

the amplifier means comprises an output for producing said bias voltage;

the source compensation means comprises a source compensating element which is connected between the output of the amplifier means and the base of the source regulating transistor and has a thermally variable compensating voltage drop which is substantially equal to said base-emitter voltage drop of the source regulating transistor;

each cell regulating transistor is a bipolar transistor including an emitter, a base and a collector;

said thermally variable voltage drop of each cell regulating transistor is a base-emitter voltage drop thereof; and each cell compensation means comprises a cell compensating element which is connected between the output of the amplifier means and the base of the cell regulating transistor and has a thermally variable compensating voltage drop which is substantially equal to said base-emitter voltage drop of the cell regulating transistor.

19. An array as in claim 18, further comprising:

current source means for causing a compensation bias current which is substantially equal to said predetermined value of main bias current to flow through the source compensating element;

current source means for causing a compensation bias current which is substantially equal to said predetermined value of main bias current to flow through each cell compensating element; and current sink means for sinking said compensation bias currents from the output of the amplifier means such that substantially no current flows through the output of the amplifier means.

20. An array as in claim 18, in which:

the source compensating element comprises a diode-connected source compensating transistor;

said thermally variable compensating voltage drop of the source compensating transistor is a base-emitter voltage drop thereof;

each cell compensating element comprises a diode-connected cell compensating transistor; and said thermally variable compensating voltage drop of the cell compensating transistor is a base-emitter voltage drop thereof.

21. An array as in claim 20, in which:

the source compensation means further comprises current source means for causing a compensation bias current which is substantially equal to said predetermined value of main bias current to flow through the source compensating transistor; and each cell compensation means further comprises current source means for causing a compensation bias current which is substantially equal to said predetermined value of main bias current to flow through the cell compensating transistor.

22. An array as in claim 21, further comprising current sink means for sinking said compensation bias currents from the output of the amplifier means such that substantially no current flows through the output of the amplifier means.

* * * * *